US010630273B2

(12) United States Patent
Tung et al.

(10) Patent No.: US 10,630,273 B2
(45) Date of Patent: Apr. 21, 2020

(54) CLOCK CIRCUIT HAVING A PULSE WIDTH ADJUSTMENT MODULE

(71) Applicant: REALTEK SEMICONDUCTOR CORP., Hsinchu (TW)

(72) Inventors: Ming-Hui Tung, Hsinchu (TW); Li-Jun Gu, Jiangsu (CN); Guan-Yu Chen, Hsinchu County (TW); Bo-Yu Chen, Taichung (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/392,702

(22) Filed: Apr. 24, 2019

(65) Prior Publication Data

US 2020/0052681 A1 Feb. 13, 2020

(30) Foreign Application Priority Data

Aug. 7, 2018 (CN) .......................... 2018 1 0893673

(51) Int. Cl.
*H03K 3/017* (2006.01)
*H03K 5/156* (2006.01)
*H03K 7/08* (2006.01)

(52) U.S. Cl.
CPC ........... *H03K 5/1565* (2013.01); *H03K 3/017* (2013.01); *H03K 7/08* (2013.01)

(58) Field of Classification Search
CPC ......... H03K 3/017; H03K 5/1565; H03K 7/08
USPC ......................... 327/175, 291, 292, 295, 299
See application file for complete search history.

(56) References Cited

U.S. PATENT DOCUMENTS

2014/0169435 A1* 6/2014 Choi .................... H03K 5/1565 375/232
2015/0222254 A1* 8/2015 Walker ..................... H03K 5/05 327/175
2016/0226474 A1* 8/2016 Roytman ................ H03K 5/26

OTHER PUBLICATIONS

Yohan Frans, et al., "A 40-to-64Gb/s NRZ Transmitter with Supply-Regulated Front-End in 16nm FinFET", 2016 IEEE International Solid-State Circuits Conference (ISSCC).
Ravi Mehta, et al., "A Programmable, Multi-GHz, Wide-Range Duty Cycle Correction Circuit in 45nm CMOS Process", 2012 Proceedings of the ESSCIRC (ESSCIRC).

* cited by examiner

*Primary Examiner* — William Hernandez
(74) *Attorney, Agent, or Firm* — Li & Cai Intellectual Property (USA) Office

(57) ABSTRACT

A clock circuit has a clock input terminal, a first clock output terminal, and a second clock output terminal. The clock circuit includes a pulse width adjustment module, a sampling module, a comparing module, and a differential signal converting module. A differential input terminal is electrically connected to a pulse width output terminal of the pulse width adjustment module. A positive differential signal output terminal and a negative differential signal output terminal are electrically connected to the first clock output terminal of the clock circuit and the second clock output terminal to output two clock signals with a phase difference of 180 degrees, respectively. A second input terminal of the sampling module is electrically connected to the second clock output terminal.

20 Claims, 10 Drawing Sheets

1
11
VCC
M1
M2
M3
M4
GND
BU1
First buffer circuit
IN
11-1
11-2
11-3
DEFIN
16
OUT+
OUT-
BU2
Second buffer circuit
OUT1
BU3
Third buffer circuit
OUT2
Vcom
12-1
Vsa1
12-2
Comparing module
12
12-3
13
Sampling module
13-1
13-2
13-3

CLOCK CIRCUIT HAVING A PULSE WIDTH ADJUSTMENT MODULE

CROSS-REFERENCE TO RELATED PATENT APPLICATION

This application claims the benefit of priority to China Patent Application No. 201810893673.2, filed on Aug. 7, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a clock circuit, and more particularly to a clock circuit having a pulse width adjustment module.

BACKGROUND OF THE DISCLOSURE

Accurate clock signals are very important in a circuit. The quality of the clock signal directly affects the performance of the circuit. In general, the clock circuit mostly uses an inverter or a buffer circuit. However, P-type metal oxide semiconductor field effect transistors (P-MOSFET) and N-type metal oxide semiconductor field effect transistors (N in the circuit)—MOSFET) are structurally asymmetric. If there is a mismatch in the circuit design, the duty cycle of the clock signal easily has a deviation.

In the development of the pulse width adjustment circuit, although the developer can correct the duty cycle of the clock signal, the developer can only adjust the calibration step by step to determine the circuit parameters for adjusting to the precise duty cycle. Since the circuit is complex, the development schedule is delayed accordingly.

Therefore, it has become an important issue to provide a clock circuit with a simple circuit to shorten the development schedule.

SUMMARY OF THE DISCLOSURE

In response to the above-referenced technical inadequacies, the present disclosure provides a clock circuit having a pulse width adjustment module.

In one aspect, the present disclosure provides a clock circuit having a clock input terminal and a clock output terminal. The clock input terminal receives an input clock signal, and the clock output terminal outputs an output clock signal. The clock circuit includes: a pulse width adjustment module including a pulse width input terminal, a control terminal, a power terminal, a ground terminal, and a pulse width output terminal. The pulse width input terminal is electrically connected to the clock input terminal to receive the input clock signal, the power terminal is electrically connected to a first reference voltage, the ground terminal electrically connected to a ground voltage, and the pulse width output terminal is electrically connected to the clock output terminal. A sampling module includes a first input terminal, a second input terminal, and a first output terminal, the first input terminal of the sampling module electrically connected to the clock output terminal of the clock circuit, the sampling module used for sampling a first sampling voltage of the clock output terminal of the clock circuit, and the first output terminal used to output the first sampling voltage; a comparing module includes a first comparing input, a second comparing input terminal, and a comparing output terminal, the second comparing input terminal electrically connected to the second input terminal of the sampling module, and the second comparing input terminal receiving the first sampling voltage, the comparing output terminal of the comparing module electrically connected to the control terminal of the pulse width adjustment module; a differential signal converting module defined between the pulse width output terminal and the clock output terminal, the differential signal converting module including a differential input terminal, a positive differential signal output terminal, and a negative differential signal output terminal; wherein the clock circuit further includes another clock output terminal, the differential input terminal is electrically connected to the pulse width output terminal of the pulse width adjustment module, the positive differential signal output terminal and the negative differential signal output terminal are electrically connected to the clock output terminal of the clock circuit and the another clock output terminal to output two clock signals with a phase difference of 180 degrees, respectively, and the second input terminal of the sampling module is electrically connected to the another clock output terminal.

In certain embodiments, the present disclosure provides a clock circuit having a clock input terminal and a clock output terminal. The clock input terminal receives an input clock signal, and the clock output terminal outputs an output clock signal. The clock circuit includes: a first inverter including a first terminal, and a second terminal, the first terminal of the first inverter electrically connected to the clock input terminal, the second terminal of the first inverter electrically connected to the clock output terminal; a second inverter including a first terminal and a second terminal, the first terminal of the second inverter electrically connected to the clock input terminal; a pulse width adjustment module including a pulse width input terminal, a control terminal, a power terminal, a ground terminal, and a pulse width output terminal, the pulse width input terminal electrically connected to the clock input terminal to receive the input clock signal, the power terminal electrically connected to a first reference voltage; a sampling module including a first terminal and a second terminal, the first terminal of the sampling terminal electrically connected to the clock output terminal of the clock circuit, the sampling module used for sampling a first sampling voltage of the clock output terminal of the clock circuit; and a comparing module includes a first comparing input terminal, a second comparing input terminal, and a comparing output terminal, the first comparing input terminal electrically connected to a comparing reference voltage, the second comparing input terminal electrically connected to the second terminal of the sampling module, the comparing output terminal electrically connected to the control terminal of the pulse width adjustment module. The second terminal of the second inverter is electrically connected to the pulse width input terminal of the pulse width adjustment module.

In one aspect, the present disclosure provides a clock circuit having a first clock input terminal, a second clock input terminal, a first clock output terminal, and a second clock output terminal. The first clock input terminal and the second clock input terminal receive an input clock signal, and the first clock output terminal and the second clock output terminal output an output clock signal. The clock circuit includes: a first clock inverter including a first terminal and a second terminal, the first terminal of the first clock inverter electrically connected to the first clock input terminal, the second terminal of the first clock inverter electrically connected to the first clock output terminal; a second clock inverter including a first terminal and a second terminal, the first terminal of the second clock inverter electrically connected to the second clock input terminal, the second terminal of the second clock inverter electrically connected to the second clock output terminal; a first pulse width adjustment module including a first pulse width input terminal, a first control terminal, a first power terminal, a first ground terminal, and a first pulse width output terminal, the first pulse width input terminal electrically connected to the first clock input terminal to receive the input clock signal, the first power terminal electrically connected to a first reference voltage, the first ground terminal electrically connected to a ground voltage, and the first pulse width output terminal electrically connected to the second clock output terminal; a second pulse width adjustment module including a second pulse width input terminal, a second control terminal, a second power terminal, a second ground terminal, and a second pulse width output terminal, the second pulse width input terminal electrically connected to the second clock input terminal, the second power terminal electrically connected to a third reference voltage, the second ground terminal electrically connected to a fourth reference voltage, and the second pulse width output terminal electrically connected to the first clock output terminal; a first sampling module including a first terminal and a second terminal, the first terminal of the first sampling module electrically connected to the first clock output terminal of the clock circuit, the first sampling module used for sampling a first sampling voltage of the first clock output terminal of the clock circuit; a second sampling module including a first terminal and a second terminal, the first terminal of the second sampling module electrically connected to the second clock output terminal of the clock circuit, the second sampling module used for sampling a second sampling voltage of the second clock output terminal of the clock circuit; a first comparing module includes a first comparing input terminal, a second comparing input terminal, and a comparing output terminal, the first comparing input terminal of the first comparing module electrically connected to a first comparing reference voltage, the second comparing input terminal of the first comparing module electrically connected to the second terminal of the first sampling module, the second comparing input terminal receiving the first sampling voltage, the comparing output terminal of the first comparing module electrically connected to the first control terminal of the first pulse width adjustment module; a second comparing module includes a first comparing input terminal, a second comparing input terminal, and a comparing output terminal, the first comparing input terminal of the second comparing module electrically connected to a second comparing reference voltage, the second comparing input terminal of the second comparing module electrically connected to the second terminal of the second sampling module, the second comparing input terminal receiving the second sampling voltage, the comparing output terminal of the second comparing module electrically connected to the second control terminal of the second pulse width adjustment module.

Therefore, the clock circuit of the present disclosure uses a simple pulse width adjustment module combined with the feedback control of the sampling module and the comparing module, to effectively regulate the duty cycle of the input clock signal. The duty cycle of the output clock signal output by the clock circuit can be locked at 50%. The pulse width adjustment module of the present disclosure not only has a simple structure, but also effectively reduces the circuit cost, which also can effectively monitor and adjust the duty cycle of the output clock signal and improve the performance of the circuit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
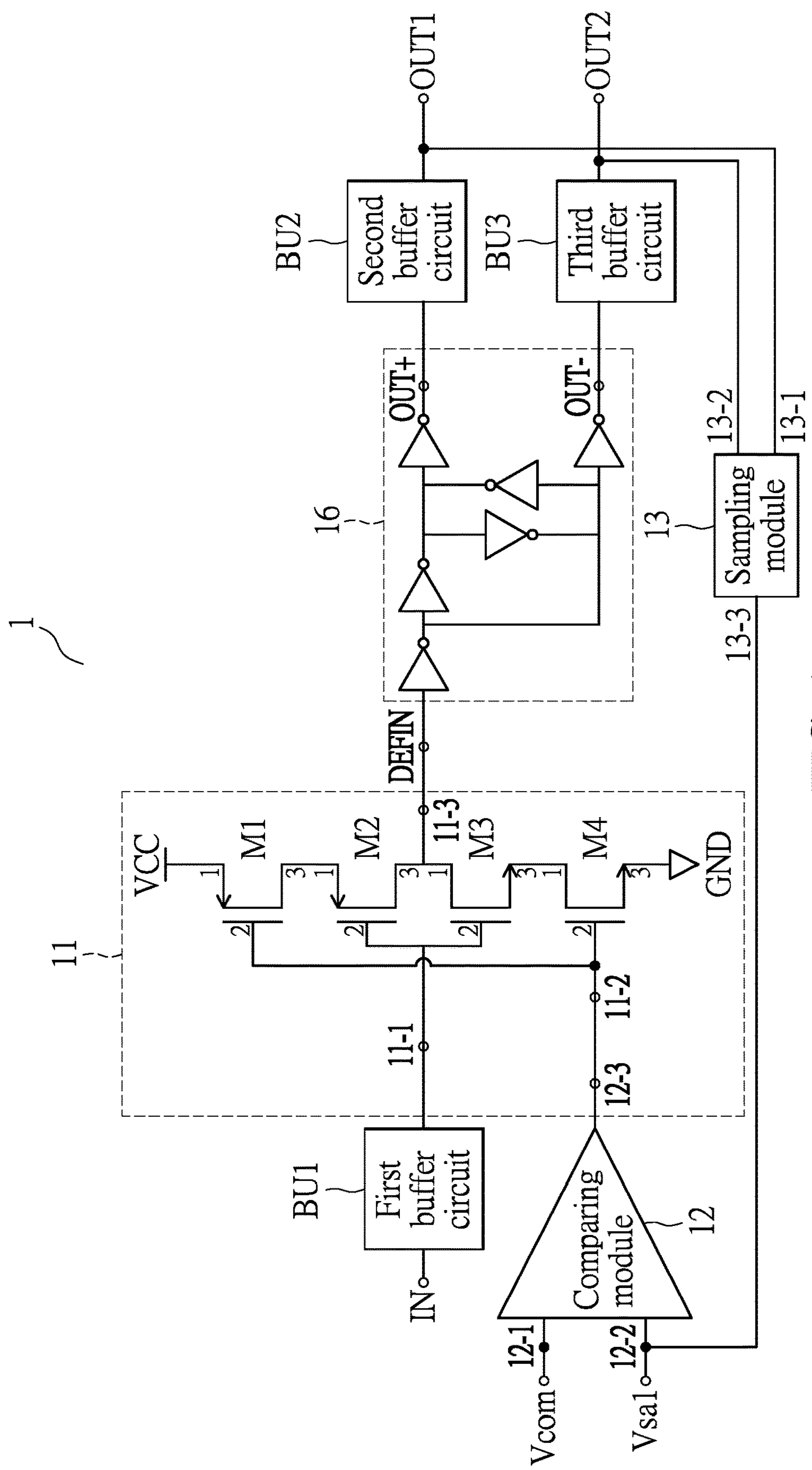
FIG. 1 is a schematic illustration of a clock circuit of a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic illustration of a clock circuit of a first embodiment of the present disclosure.

In the embodiment, a clock circuit 1 includes a clock input terminal and a clock output terminal. The clock input terminal is used for receiving an input clock signal, and the clock output terminal outputs an output clock signal. In the embodiment, the input clock signal is an unadjusted and uncorrected clock signal. In other words, the duty cycle of the input clock signal is not necessarily 50%, which may be 40% or 60%. In the embodiment, the output clock signal is the adjusted and corrected clock signal. In other words, the duty cycle of the output clock signal is 50%.

The clock circuit 1 includes a pulse width adjustment module 11, a comparing module 12, a sampling module 13, and a differential signal converting module 16.

The pulse width adjustment module 11 includes a pulse width input terminal 11-1, a control terminal 11-2, a power terminal VCC, a ground terminal GND, and a pulse width output terminal 11-3.

The pulse width input terminal 11-1 is electrically connected to the clock input terminal IN to receive the input clock signal. The power terminal VCC is electrically connected to a first reference voltage (not shown), and the ground terminal GND is electrically connected to a ground voltage. The first reference voltage (not shown) is greater than the ground voltage.

The first input terminal 13-1 and the second input terminal 13-2 of the sampling module 13 are electrically connected to the first clock output terminal OUT1 and the second clock output terminal OUT2 of the clock circuit 1, respectively, for obtaining at least one first sampling voltage Vsa1. In the embodiment, the first sampling voltage Vsa1 may be sampled based on the output voltage of the first clock output terminal OUT1 or the second clock output terminal OUT2 or based on the voltages of the first clock output terminal OUT1 and the second clock, which can be adjusted based on the actual requirement, and is not limited in the present disclosure. In the present embodiment, the first sampling voltage Vsa1 is determined based on the output voltage of the first clock output terminal OUT1 and the output voltage of the second clock output terminal OUT2. In the embodiment, the sampling module 13 further includes a first output terminal 13-3 for electrically connecting to the second comparing input terminal 12-2 of the comparing module 12.

The differential signal converting module 16 includes a differential signal input terminal DEFIN, a positive differential signal output terminal OUT+, and a negative differential signal output terminal OUT−.

The differential signal input terminal DEFIN is electrically connected to the pulse width output terminal 11-3 of the pulse width adjustment module 11. The differential signal converting module 16 receives the output clock signal to output two clock signals with a phase difference of 180 degrees by the positive differential signal output terminal OUT+ and the negative differential signal output terminal OUT−.

In the embodiment, the differential signal converting module 16 includes a plurality of inverters. The circuit of the differential signal converting module 16 can be designed and adjusted based on actual requirement, which is not limited in the present disclosure.

The comparing module 12 includes a first comparing input terminal 12-1, a second comparing input terminal 12-2, and a comparing output terminal 12-3. The first comparing input terminal 12-1 is electrically connected to a comparing reference voltage Vcom, and the second comparing input terminal 12-2 is electrically connected to the sampling module 13 to receive the first sampling voltage Vsa1. The comparing output terminal 12-3 of the comparing module 12 is electrically connected to the control terminal 11-2 of the pulse width adjustment module 11.

In the embodiment, the clock circuit 1 further includes a first buffer circuit BU1, a second buffer circuit BU2, and a third buffer circuit BU3.

The clock input terminal IN is electrically connected to the pulse width input terminal 11-1 of the pulse width adjustment module 11 through the first buffer circuit BU1. The positive differential signal output terminal OUT+ and the negative differential signal output terminal OUT− are electrically connected to the first clock output terminal OUT1 and the second clock output terminal OUT2 through the second buffer circuit BU2 and the third buffer circuit BU3, respectively.

In the embodiment, an input clock signal is converted into two output clock signals with a phase difference of 180 degrees. The pulse width adjustment module 11, the comparing module 12, and the sampling module 13 are used for regulating the duty cycle of the output clock signals.

In the present embodiment, the comparing reference voltage Vcom can be set to a half of the amplitude of the input clock signal. For example, the amplitude of the input clock signal is VDD, and the comparing reference voltage Vcom can be set to 0.5*VDD. In other words, when the voltage of the input clock signal is VDD and the duty cycle is 50%, the average voltage is 0.5*VDD. In other embodiment, if the duty cycle is 40%, the average voltage is 0.4*VDD.

In addition, in the embodiment, the first sampling voltage Vsa1 is a voltage of the DC component of the output clock signal, that is, an average voltage value in one cycle.

In the embodiment, the pulse width adjustment module 11 includes a first high side switch M1, a second high side switch M2, a first low side switch M3, and a second low side switch M4.

The first high side switch M1 includes a first terminal, a second terminal and a third terminal. The second high side switch M2 includes a first terminal, a second terminal, and a third terminal. The first low side switch M3 includes a first terminal, a second terminal, and a third terminal. The second low side switch M4 includes a first terminal, a second terminal, and a third terminal.

In the embodiment, the first high side switch M1 and the second high side switch M2 are P-type metal oxide semiconductor field effect transistors (P-MOSFET). The first low side switch M3 and the second low side switch M4 are N-type metal oxide semiconductor field effect transistors (N-MOSFET).

The first terminal of the first high side switch M1 is electrically connected to the power terminal VCC of the pulse width adjustment module 11. The second terminal of the first high side switch M1 is electrically connected to the second terminal of the second low side switch M4. The third terminal of the first high side switch M1 is electrically connected to the first terminal of the second high side switch M2. The second terminal of the second high side switch M2 is electrically connected to the second terminal of the first low side switch M3. The third terminal of the second high side switch M2 is electrically connected to the first low side switch M3. The third terminal of the first low side switch M3 is electrically connected to the first terminal of the second low side switch M4. The third terminal of the second low side switch M4 is electrically connected to the grounding terminal GND.

The second terminal of the first high side switch M1 and the second terminal of the second low side switch M4 are electrically connected to the control terminal 11-2 of the pulse width adjustment module 11 and the comparing output terminal 12-3 of the comparing module 12. The second terminal of the second high side switch M2 and the second terminal of the first low side switch M3 are electrically connected to the pulse width input terminal 11-1 and the clock input terminal IN of the pulse width adjustment module 11.

In the embodiment, the first reference voltage (not shown) is greater than 0V; that is, the first reference voltage can be adjusted based on actual requirements, and is not limited in the present disclosure, for example, the first reference voltage is 10V or 15V.

In the embodiment, the input clock signal is inputted to the pulse width input terminal 11-1 of the pulse width adjustment module 11, and is phased by the inverter circuit of the second high side switch M2 and the first low side switch M3.

When the first sampling voltage Vsa1 of the second comparing input terminal 12-2 of the comparing module 12 is greater than the comparing reference voltage Vcom of the first comparing input terminal 12-1, the comparing output terminal 12-3 of the comparing module 12 outputs a high voltage output signal or a low voltage output signal for controlling the second terminal of the first high side switch M1 and the second terminal of the second low side switch M4 of the pulse width adjustment module 11, which are the gate terminals of the first high side switch M1 and the second low side switch M4. Therefore, a rising time or a falling time of each cycle in the input clock signal is adjusted to modulate the duty cycle of the input clock signal.

In the embodiment, the output voltage of the comparing output terminal 12-3 of the comparing module 12 is used to turn on the channel of the first high side switch M1 and the second low side switch M4 to adjust the output effect of the second high side switch M2 and the first low side switch M3. In addition, in combination with the functions of the comparing module 12 and the pulse width adjustment module 11, the duty cycle of the output clock signal can be locked at 50%.

In the embodiment, the comparing output terminal 12-3 of the comparing module 12 outputs an analog voltage. The voltage outputted by the comparing output terminal 12-3 can be adjusted based on actual requirements. In this embodiment, the comparing output terminal 12-3 is used to turn on the first high side switching component M1, in which the voltage of the comparing output terminal 12-3 is between 0V and 1V.

In the embodiment, the comparing reference voltage Vcom is 0.5*VDD. When the first sampling voltage Vsa1 is greater than the comparing reference voltage Vcom, the comparing output terminal 12-3 outputs a control voltage such that the first high side switch M1 operates with a smaller channel. The second low side switch unit M4 is actuated in a larger-channel manner. At this time, the waveforms of the falling time interval and the rising time interval of the input clock signal are adjusted. In this case, the waveform adjustment of the rising time interval of the input clock signal is more than the waveform adjustment of the falling time interval of the input clock signal.

When the first sampling voltage Vsa1 is smaller than the comparing reference voltage Vcom, the comparing output terminal 12-3 outputs a control voltage, so that the first high side switch M1 is operated in a larger-channel manner, and the second low side switch M4 is operated in a smaller-channel manner. At this time, the falling time interval of the input clock signal and the waveform of the rising time interval are adjusted. In this case, the waveform adjustment of the falling time interval of the input clock signal is more than the waveform adjustment of the rising time interval of the input clock signal.

In the embodiment, the clock circuit 1 further includes a first buffer circuit BU1, a second buffer circuit BU2, and a third buffer circuit BU3. The first buffer circuit BU1 is disposed between the clock input terminal IN and the pulse width input terminal 11-1 of the pulse width adjustment module 11. The second buffer circuit BU2 is disposed between the positive differential signal output terminal OUT+ of the differential signal converting module 16 and the first clock output terminal OUT1. The third buffer circuit BU3 is disposed between the negative differential signal output terminal OUT− of the differential signal converting module 16 and the second clock output terminal OUT2.

Second Embodiment

Figure 2:
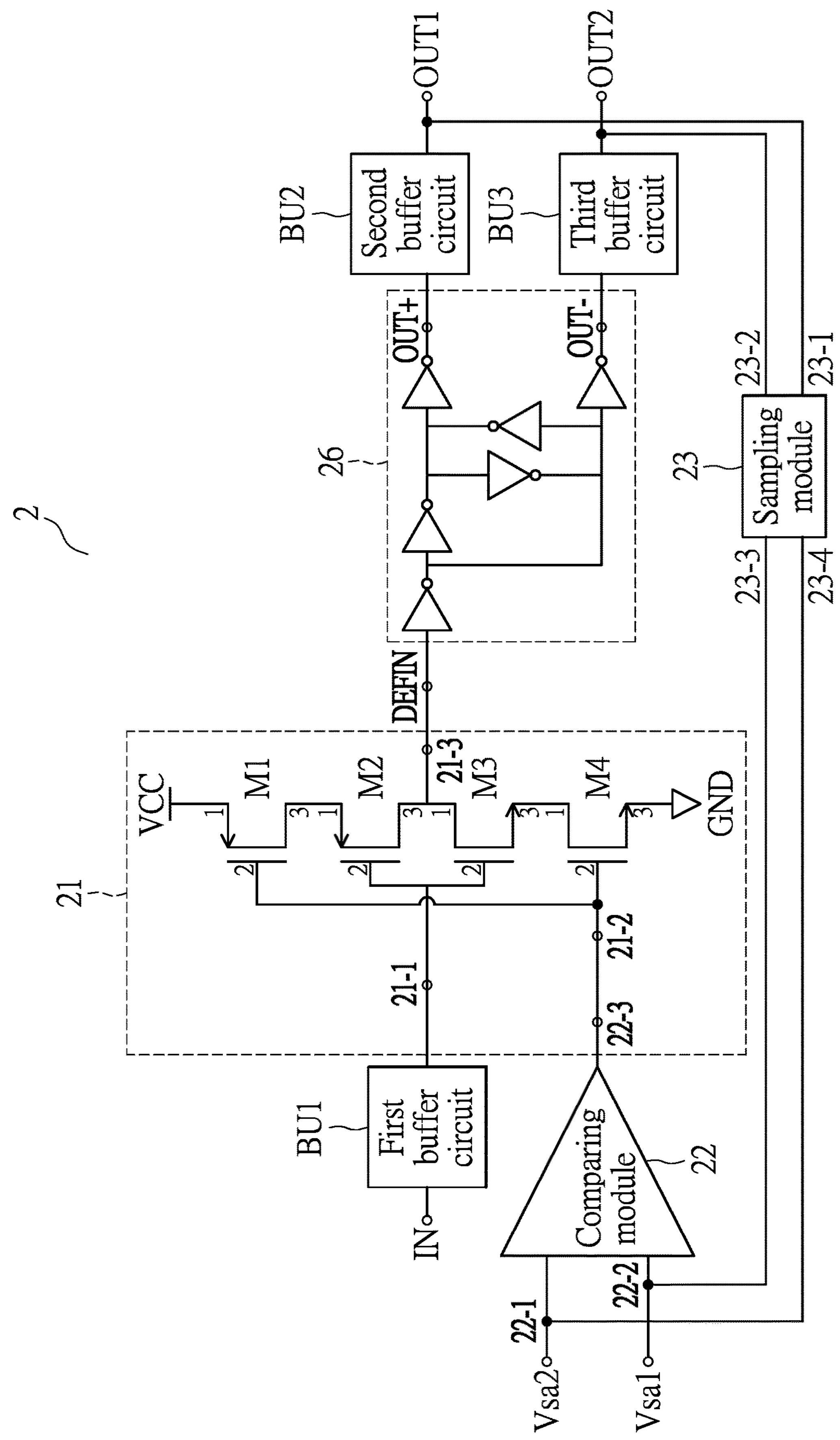
FIG. 2 is a schematic diagram of a clock circuit of a second embodiment of the present disclosure.

Referring to FIG. 2, FIG. 2 is a schematic diagram of a clock circuit of a second embodiment of the present disclosure.

The clock circuit 2 of FIG. 2 is similar to the clock circuit 1 of FIG. 1. The difference between the clock circuit 2 and the clock circuit 1 is that the first comparing input terminal 22-1 of the comparing module 22 is electrically connected to the first clock output terminal OUT1 to obtain a first sampling voltage Vsa1. The second comparing input terminal 22-2 is electrically connected to the second clock output terminal OUT2 to obtain a second sampling voltage Vsa2. The circuit configuration of the clock circuit 2 is described in detail below.

In this embodiment, the clock circuit 2 includes a pulse width adjustment module 21, a comparing module 22, a sampling module 23, and a differential signal converting module 26.

The pulse width adjustment module 21 includes a pulse width input terminal 21-1, a control terminal 21-2, a power terminal VCC, a ground terminal GND, and a pulse width output terminal 21-3.

The pulse width input terminal 21-1 is electrically connected to the clock input terminal IN to receive the input clock signal. The power terminal VCC is electrically connected to a first reference voltage (not shown). The ground terminal GND is electrically connected to a ground voltage. The first reference voltage (not shown) is greater than 0V.

The first input terminal 23-1 of the sampling module 23 is electrically connected to the first clock output terminal OUT1 of the clock circuit 2. The sampling module 23 is used for sampling an output voltage of the first clock output terminal OUT1 of the clock circuit 2 to generate the first sampling voltage Vsa1. The second input terminal 23-2 of the sampling module 23 is electrically connected to the second clock output terminal OUT2 of the clock circuit 2, and the sampling module 23 is used for sampling an output voltage of the second clock output terminal OUT2 of the clock circuit 2 to generate the second sampling voltage Vsa2. In the embodiment, the sampling module 23 further includes a first output terminal 23-3 and a second output terminal 23-4 (not shown) for electrically connecting the second comparing input terminal 22-2 and the first comparing input terminal 22-1 of the comparing module 22, respectively.

The differential signal converting module 26 includes a differential signal input terminal DEFIN, a positive differential signal output terminal OUT+, and a negative differential signal output terminal OUT−.

The differential signal input terminal DEFIN is electrically connected to the pulse width output terminal 21-3 of the pulse width adjustment module 21. The differential signal converting module 26 receives the adjusted output clock signal to output two clock signals with a phase difference of 180 degrees, in which the two clock signals are outputted through the positive differential signal output terminal OUT+ and the negative differential signal output terminal OUT−.

In the embodiment, the differential signal converting module 26 includes a plurality of inverters. The circuit of the differential signal converting module 26 can be designed and adjusted based on actual requirement, which is not limited in the present disclosure.

The comparing module 22 includes a first comparing input 22-1, a second comparing input 22-2, and a comparing output 22-3. The first comparing input terminal 22-1 is electrically connected to the sampling module 23 to obtain the first sampling voltage Vsa1. The second comparing input terminal 22-1 is electrically connected to the sampling module 23 to obtain the second sampling voltage Vsa2. The comparing output terminal 22-3 of the comparing module 22 is electrically connected to the control terminal 21-2 of the pulse width adjustment module 21.

In the embodiment, the clock circuit 2 further includes a first buffer circuit BU1, a second buffer circuit BU2, and a third buffer circuit BU3.

The clock input terminal IN is electrically connected to the pulse width input terminal 21-1 of the pulse width adjustment module 21 through the first buffer circuit BU1. The positive differential signal output terminal OUT+ and the negative differential signal output terminal OUT− are electrically connected to the first clock output terminal OUT1 and the second clock output terminal OUT2 through the second buffer circuit BU2 and the third buffer circuit BU3, respectively.

Figure 3A:
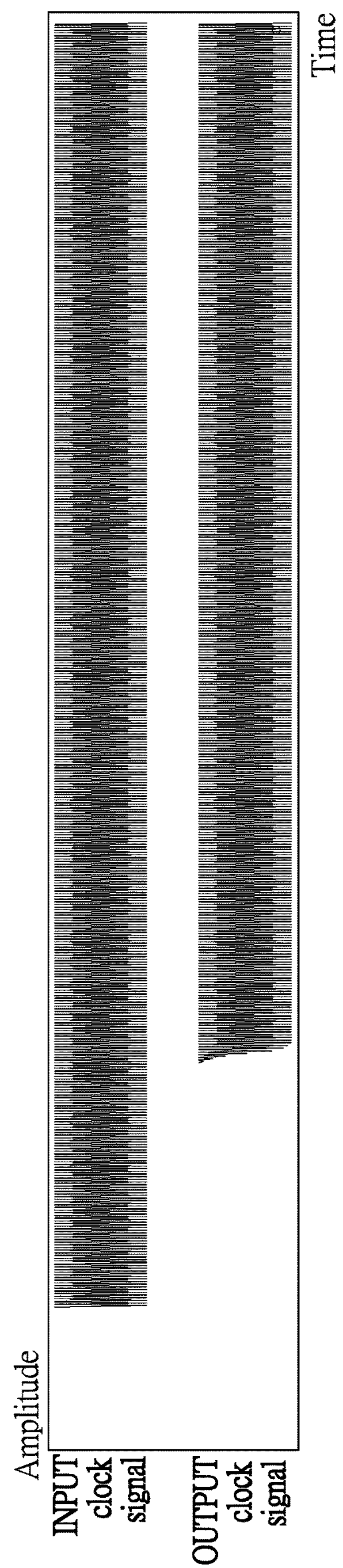
FIGS. 3A and 3B are schematic diagrams showing an unadjusted pulse width of an input clock signal of the clock circuit of FIG. 1.
Figure 3B:
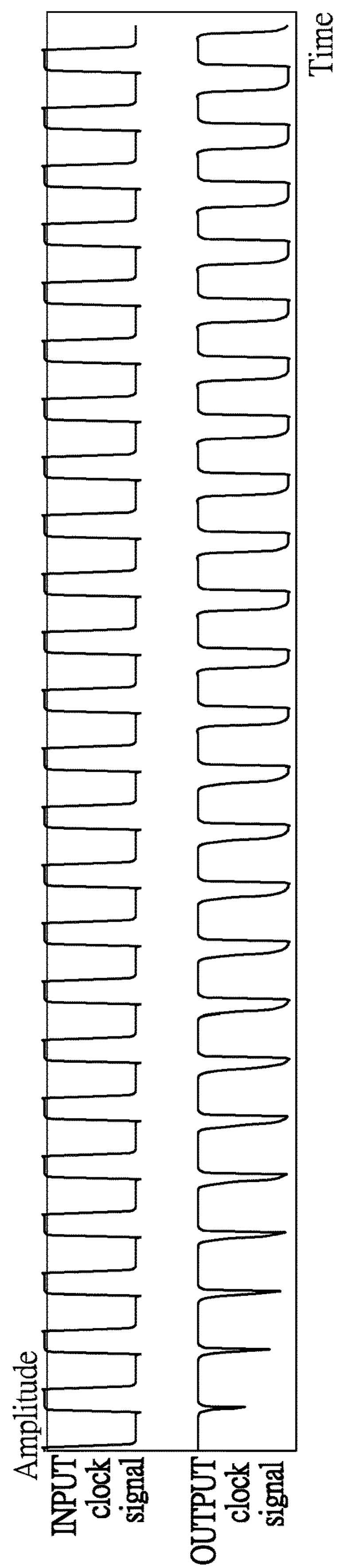
Figure 3C:
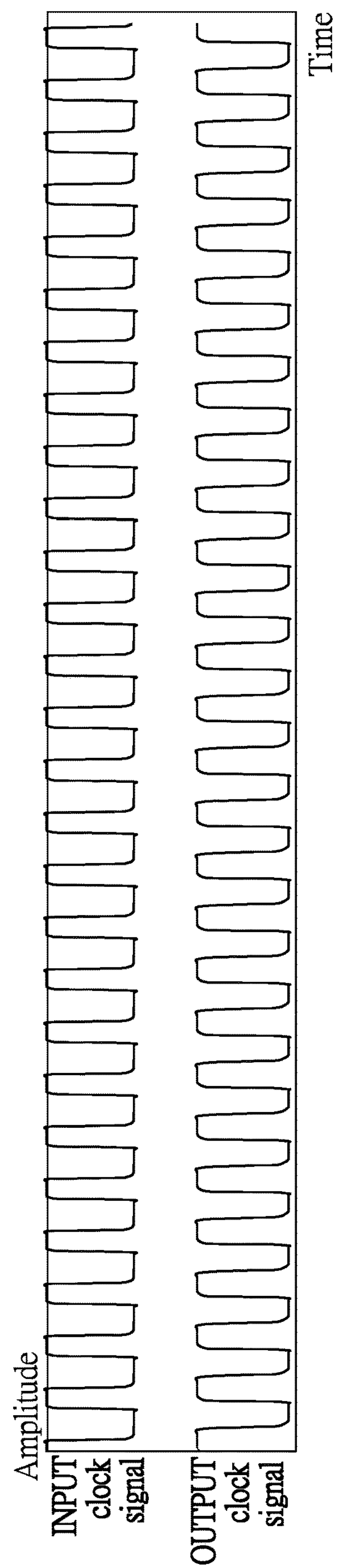
FIG. 3C is a schematic diagram of the input clock signal of the clock circuit of FIG. 1 after the pulse width is adjusted.

In this embodiment, a single input clock signal is converted into two output clock signals with a phase difference of 180 degrees. The pulse width adjustment module 21, the comparing module 22, and the sampling module 23 are used for regulating the duty cycle of the input clock signal. Referring to FIG. 3A, FIG. 3B, and FIG. 3C, FIGS. 3A and 3B are schematic diagrams showing the unadjusted pulse width of the input clock signal of the clock circuit of FIG. 1. FIG. 3C is a schematic diagram of the input clock signal of the clock circuit of FIG. 1 after adjusting the pulse width.

In FIG. 3A, the duty cycle of the input clock signal is 40%, which is less than 50%. Therefore, the first sampling voltage Vsa1 will be lower than the comparing reference voltage Vcom.

In FIG. 3B, since the first sampling voltage Vsa is smaller than the comparing reference voltage Vcom (0.5*VDD), the comparing module 12 outputs a control voltage to turn on the first high side switch M1 and the second low side switch M4 for adjusting the waveform of the rising time interval and the falling time interval of the input clock signal as shown in in FIG. 3B.

As shown in FIG. 3C, when the input clock signal is adjusted by the pulse width adjustment module 13, the duty cycle can be stabilized at 50%.

Third Embodiment

Figure 4:
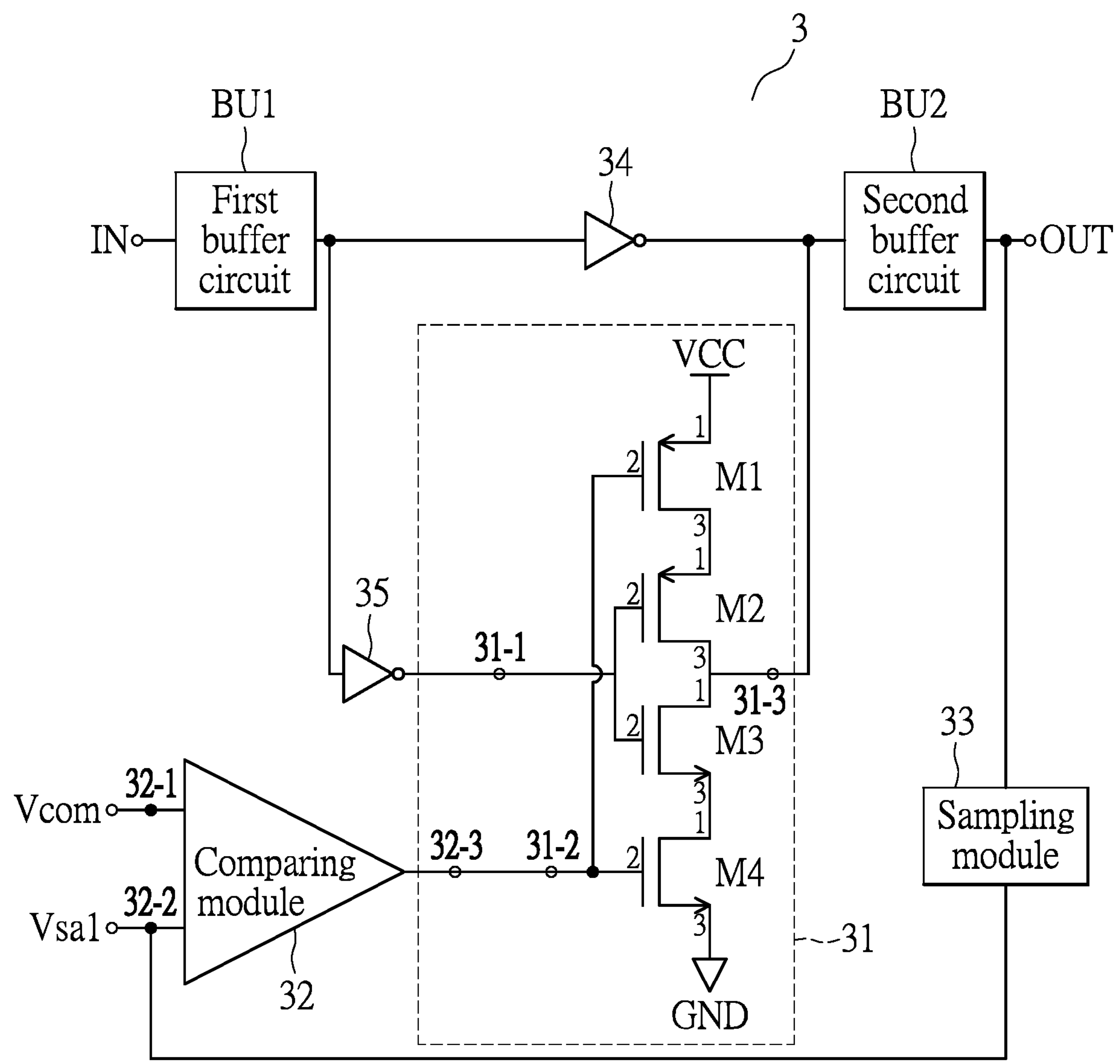
FIG. 4 is a schematic diagram of a clock circuit of a third embodiment of the present disclosure.

Referring to FIG. 4, FIG. 4 is a schematic diagram of a clock circuit of a third embodiment of the present disclosure.

In the embodiment, the clock circuit 3 includes a clock input terminal IN and a clock output terminal OUT. The clock input terminal IN receives an input clock signal, and the clock output terminal OUT outputs an output clock signal.

The clock circuit 3 includes a pulse width adjustment module 31, a comparing module 32, a sampling module 33, a first inverter 34, and a second inverter 35.

The first inverter 34 includes a first terminal and a second terminal. The first terminal of the first inverter 34 is electrically connected to the clock input terminal IN, and the second terminal of the first inverter 34 is electrically connected to the clock output terminal OUT.

The second inverter 35 includes a first terminal and a second terminal.

The pulse width adjustment module 31 includes a pulse width input terminal 31-1, a control terminal 31-2, a power terminal VCC, a ground terminal GND, and a pulse width output terminal 31-3. The power terminal VCC is electrically connected to a first reference voltage (not shown). The ground terminal GND is electrically connected to a ground voltage.

The pulse width output terminal 31-3 is electrically connected to the clock output terminal OUT. The first reference voltage (not shown) is greater than the ground voltage.

The sampling module 33 includes a first terminal and a second terminal. The first terminal of the sampling module 33 is electrically connected to the clock output terminal OUT of the clock circuit 3, and the sampling module 33 is used for sampling an output voltage of the clock output terminal OUT of the clock circuit 3 to generate a first sampling voltage Vsa1.

The comparing module 32 includes a first comparing input 32-1, a second comparing input 32-2, and a comparing output 32-3. The first comparing input terminal 32-1 is electrically connected to a comparing reference voltage Vcom. The second comparing input terminal 33-2 is electrically connected to the second terminal of the sampling module 33. The second comparing input terminal 32-2 receives the first sampling voltage Vsa1. The comparing output terminal 32-3 of the comparing module 32 is electrically connected to the control terminal 31-2 of the pulse width adjustment module 31.

The second terminal of the second inverter 35 is electrically connected to the pulse width input terminal 31-1 of the pulse width adjustment module 31.

The pulse width adjustment module 31 includes a first high side switch M1, a first high side switch M2, a first low side switch M3, and a second low side switch M4.

The first high side switch M1 includes a first terminal, a second terminal and a third terminal. The first high side switch M2 includes a first terminal, a second terminal and a third terminal. The first low side switch M3 includes a first terminal, a second terminal, and a third terminal. The second low side switch M4 includes a first terminal, a second terminal, and a third terminal.

The first terminal of the first high side switch M1 is electrically connected to the power terminal VCC of the pulse width adjustment module 21. The second terminal of the first high side switch M1 is electrically connected to the second terminal of the second low side switch M4. The third terminal of the first high side switch M1 is electrically connected to the first terminal of the second high side switch M2. The second terminal of the second high side switch M2 is electrically connected to the second terminal of the first low side switch M3. The third terminal of the second high side switch M2 is electrically connected to the first terminal of the first low side switch M3. The third terminal of the first low side switch M1 is electrically connected to the first terminal of the second low side switch M4. The third terminal of the second low side switch M4 is electrically connected to the ground GND.

In the embodiment, the clock circuit 3 further includes a first buffer circuit BU1 and a second buffer circuit BU2. The first buffer circuit BU1 is disposed between the clock input terminal IN and the first inverter 34. The second buffer circuit BU2 is disposed between the first inverter and the clock output terminal OUT.

In the embodiment, the pulse width input terminal 31-1 is electrically connected to the clock input terminal IN through the second inverter 35 and first buffer circuit BU1 for receiving the input clock signal.

In the embodiment, the pulse width adjustment module 31 is used as a feedback unit to adjust the input clock signal.

Figure 5A:
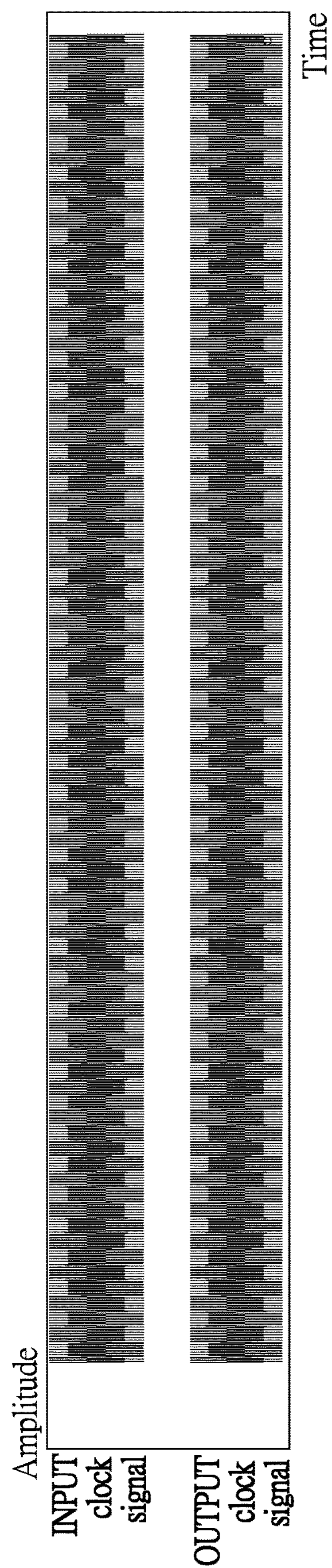
FIGS. 5A and 5B are schematic diagrams showing the unadjusted pulse width of the input clock signal of the clock circuit of FIG. 4.
Figure 5B:
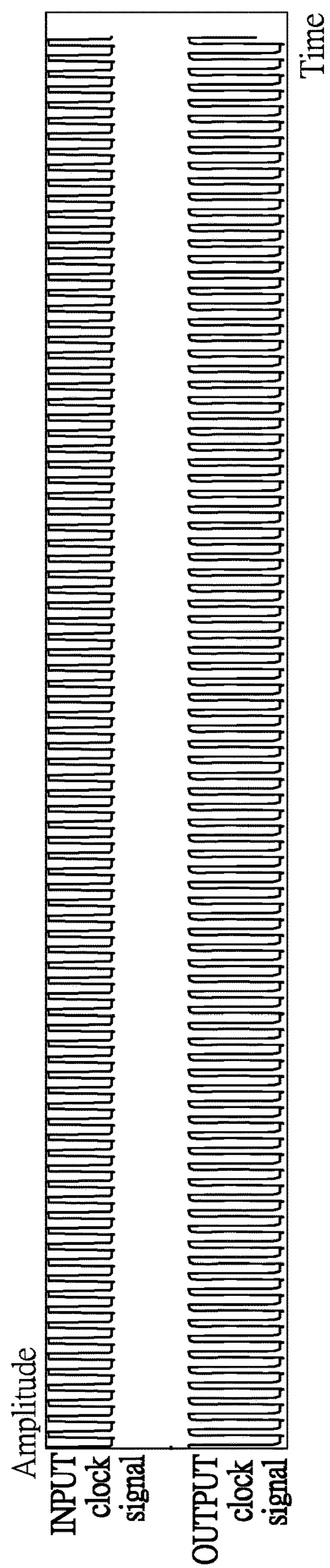
Figure 5C:
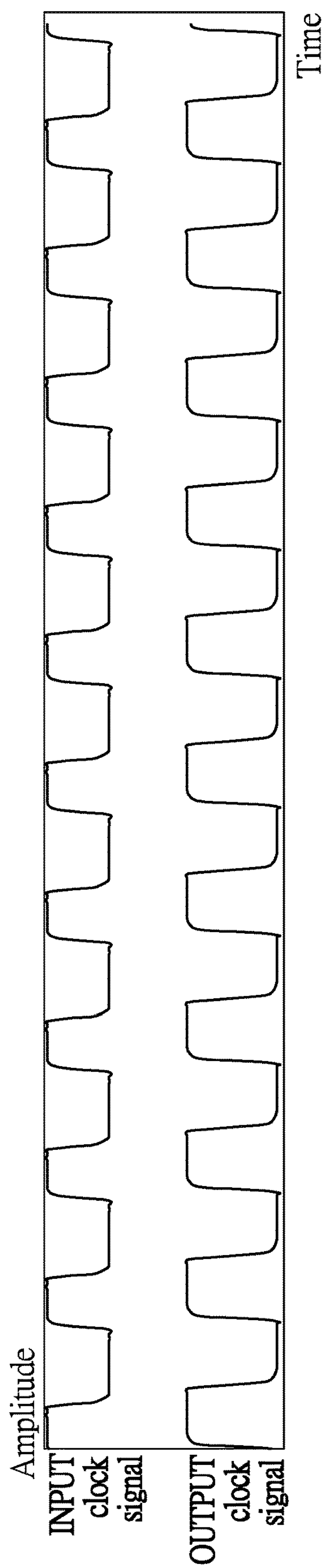
FIG. 5C is a schematic diagram of the input clock signal of the clock circuit of FIG. 4 after the pulse width is adjusted.

Referring to FIG. 5A, FIG. 5B and FIG. 5C, FIGS. 5A and 5B are schematic diagrams showing the unadjusted pulse width of the input clock signal of the clock circuit of FIG. 5C is a schematic diagram of the input clock signal of the clock circuit of FIG. 4 after the pulse width is adjusted.

In FIG. 5A, the duty cycle of the input clock signal is 40%, which is less than 50%. Therefore, the first sampling voltage Vsa1 will be lower than the comparing reference voltage Vcom.

In FIG. 5B, since the first sampling voltage Vsa1 is smaller than the comparing reference voltage Vcom (0.5*VDD), the comparing module 32 outputs a control voltage to turn on the first high side switch M1 and the second low side switch M4 for adjusting the waveform of the rising time interval and the falling time interval of the input clock signal, in which the waveform of the output clock signal is as shown in FIG. 5B.

As shown in FIG. 5C, when the input clock signal is adjusted by the pulse width adjustment module 33, the duty cycle can be stabilized at 50%.

Fourth Embodiment

Figure 6:
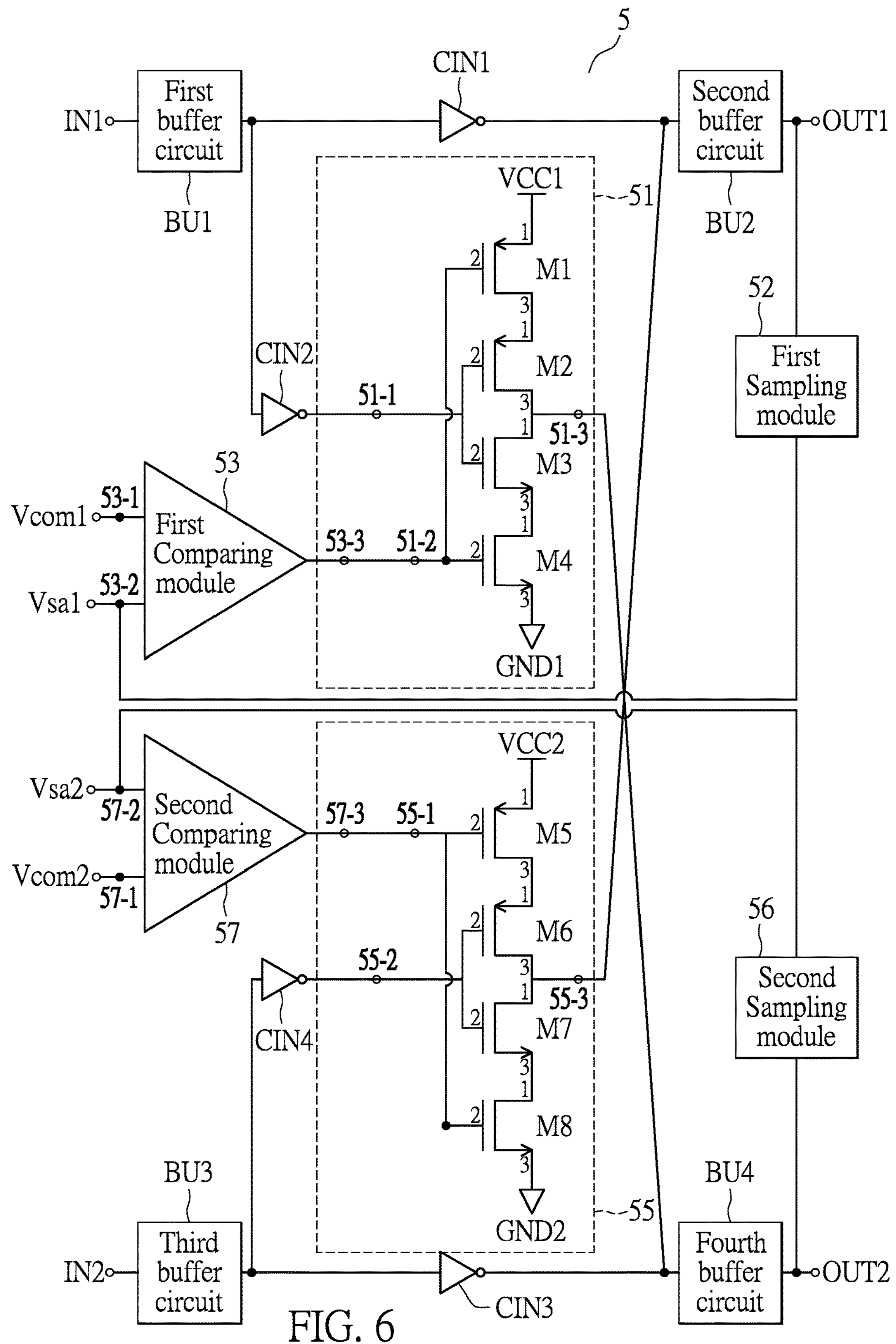
FIG. 6 is a schematic diagram of a clock circuit of a fourth embodiment of the present disclosure.

Referring to FIG. 6, FIG. 6 is a schematic diagram of a clock circuit of a fourth embodiment of the present disclosure.

In the embodiment, the clock circuit 5 includes a first clock input terminal IN1, a second clock input terminal IN2, a first clock output terminal OUT1, and a second clock output terminal OUT2.

The first clock input terminal IN1 receives a first input clock signal, and the second clock input terminal IN2 receives a second input clock signal. In the embodiment, the first input clock signal and the second clock input signal have a phase difference of 180 degrees. The first clock output terminal OUT1 and the second clock output terminal OUT2 are the positive terminal of the differential signal and the negative terminal of the differential signal. In the embodiment, the first clock output terminal OUT1 is the positive differential signal output terminal, and the second clock output terminal OUT2 is the negative differential signal output terminal.

The clock circuit 5 includes a first clocked inverter CIN1 and a second clocked inverter CIN2. The first clocked inverter CIN1 includes a first terminal and a second terminal. The first terminal of the first clocked inverter CIN1 is electrically connected to the first clock input terminal IN1, and the second terminal of the first clocked inverter CIN1 is electrically connected to the first clock output terminal OUT1.

The second clocked inverter CIN2 includes a first terminal and a second terminal. The first terminal of the second clocked inverter CIN2 is electrically connected to the second clock input terminal IN2, and the second terminal of the second clocked inverter CIN2 is electrically connected to the second clock output terminal OUT2.

In the embodiment, the clock circuit 5 further includes the first buffer circuit BU1, the second buffer circuit BU2, the third buffer circuit BU3, and the fourth buffer circuit BU4.

The first pulse width adjustment module 51 has a first pulse width input terminal 51-1, a first control terminal 51-2, a first power source terminal VCC1, a first ground terminal GND1, and a first pulse width. The first pulse width input terminal is electrically connected to the first clock input terminal IN1 to receive the input clock signal through the second clocked inverter CIN2 and first buffer circuit BU1, and the first power terminal VCC1 is electrically connected to a first reference voltage (not shown). The first ground terminal GND1 is electrically connected to a ground voltage, and the first pulse width output terminal 51-3 is electrically connected to the second clock output terminal OUT2 through the second buffer circuit BU2.

The second pulse width adjustment module 55 has a second pulse width input terminal 55-1, a second control terminal 55-2, a second power supply terminal VCC2, a second ground terminal GND2, and a second pulse width output terminal 55-3. The second pulse width input terminal 55-1 is electrically connected to the second clock input terminal IN2 to receive the second input clock signal through the fourth clocked inverter CIN4 and the third buffer circuit BU3. The second power supply terminal VCC2 is electrically connected to a third reference voltage (not shown), and the second ground terminal GND2 is electrically connected to a fourth reference voltage (not shown), and the second pulse width output terminal is electrically connected to the first One clock output terminal OUT1 through the fourth buffer circuit BU4.

The first sampling module 52 has a first terminal and a second terminal. The first terminal of the first sampling module 52 is electrically connected to the first clock output terminal OUT1 of the clock circuit 5, and the first sampling module 52. A first sampling voltage Vsa1 is generate by sampling an output voltage of the first clock output terminal OUT1 of the clock circuit 5.

The second sampling module 56 has a first terminal and a second terminal. The first terminal of the second sampling module 56 is electrically connected to the second clock output terminal OUT2 of the clock circuit 5, and the second sampling module 56. A second sampling voltage Vsa2 for sampling the second clock output terminal OUT2 of the clock circuit 5.

The first comparing module 53 includes a first comparing input terminal 53-1, a second comparing input terminal 53-2, and a comparing output terminal 53-3. The first comparing input terminal 53-1 of the first comparing module 53 is electrically connected to a first comparing reference voltage Vcom1. The second comparing input terminal 53-2 of the first comparing module 53 is electrically connected to the second terminal of the first sampling module 52. The second comparing input terminal 53-2 of the first comparing module 53 receives the first sampling voltage Vsa1, and the comparing output terminal 53-3 of the first comparing module 53 is electrically connected to the first control terminal 51-2 of the pulse width adjustment module 51.

The second comparing module 57 includes a first comparing input terminal 57-1, a second comparing input terminal 57-2, and a comparing output terminal 57-3. The first comparing input terminal 57-1 of the second comparing module 57 is electrically connected to a second comparing reference voltage Vcom2. The second comparing input terminal 57-2 of the second comparing module 57 is electrically connected to the second terminal of the second sampling module 56. The second comparing terminal 57-2 of the second comparing module 57 receives the second sampling voltage Vsa2, and the comparing output 57-3 of the second comparing module 57 is electrically connected to the second control input 55-2 of the second pulse width adjustment module 55.

The first pulse width adjustment module 51 includes a first high side switch M1, a second high side switch M2, a first low side switch M3, and a second low side switch M4.

The first high side switch M1 includes a first terminal, a second terminal and a third terminal. The second high side switch M2 includes a first terminal, a second terminal, and a third terminal. The first low side switch M3 includes a first terminal, a second terminal, and a third terminal. The second low side switch M4 includes a first terminal, a second terminal, and a third terminal.

The first terminal of the first high voltage side switch M1 of the first pulse width adjustment module 51 is electrically connected to the first power terminal VCC1 of the first pulse width adjustment module 51. The second terminal of the first high side switch M1 of the first pulse width adjustment module 51 is electrically connected to the second terminal of the second low side switch M4 of the first pulse width adjustment module 51. The third terminal of the first high side switch M1 of the first pulse width adjustment module 51 is electrically connected to the first terminal of the second high side switch M2 of the first pulse width adjustment module M1. The second terminal of the second high side switch M2 of the first pulse width adjustment module 51 is electrically connected to the second terminal of the first low side switch M3 of the first pulse width adjustment module 51. The third terminal of the second high side switch M2 of the first pulse width adjustment module 51 is electrically connected to the first terminal of the first low side switch M3 of the first pulse width adjustment module 51. The third terminal of the first low side switch M3 of the first pulse width adjustment module 51 is electrically connected to the first terminal of the second low side switch M4 of the first pulse width adjustment module 51. The third terminal of the second low side switch M4 of the first pulse width adjustment module 51 is electrically connected to the first ground GND1.

The second pulse width adjustment module 55 includes a first high side switch M5, a second high side switch M6, a first low side switch M7, and a second low side switch M8.

The first high side switch M5 includes a first terminal, a second terminal, and a third terminal. The second high side switch M6 includes a first terminal, a second terminal, and a third terminal. The first low side switch M7 includes a first terminal, a second terminal, and a third terminal. The second low side switch M8 includes a first terminal, a second terminal, and a third terminal.

The first terminal of the first high voltage side switch M5 of the second pulse width adjustment module 55 is electrically connected to the second power terminal VCC2 of the second pulse width adjustment module 55. The second terminal of the first high side switch M5 of the second pulse width adjustment module 55 is electrically connected to the second terminal of the second low side switch M8 of the second pulse width adjustment module 55. The third terminal of the first high side switch M5 of the second pulse width adjustment module 55 is electrically connected to the first terminal of the second high side switch M6 of the second pulse width adjustment module 55. The second terminal of the second high side switch M6 of the second pulse width adjustment mode 55 is electrically connected to the second terminal of the first low side switch M7 of the second pulse width adjustment module 55. The third terminal of the second high side switch M6 of the second pulse width adjustment module 55 is electrically connected to the first terminal of the first low side switch M7 of the second pulse width adjustment module 55. The third terminal of the first low side switch M7 of the second pulse width adjustment module 55 is electrically connected to the first terminal of the second low side switch M8 of the second pulse width adjustment module 55. The third terminal of the second low side switch M8 of the second pulse width adjustment module 55 is electrically connected. Two ground terminals GND2.

The first buffer circuit BU1 is disposed between the first clock input terminal IN1 and the first clock inverter CIN1. The second buffer circuit BU2 is disposed between the first clocked inverter CIN1 and the first clock output terminal OUT1. The third buffer circuit BU3 is disposed between the second clock input terminal IN1 and the third clock inverter CIN1. The second buffer circuit BU2 is disposed between the first clocked inverter CIN1 and the first clock output terminal OUT1.

In the embodiment, the clock circuit 5 uses the first pulse width adjustment module 51 and the second pulse width adjustment module 55 to regulate the output clock signals of the second clock output terminal OUT2 and the first clock output terminal OUT1, respectively.

In conclusion, the clock circuit of the embodiment of the present disclosure uses a simple pulse width adjustment module combined with the feedback control of the sampling module and the comparing module, to effectively regulate the duty cycle of the input clock signal. The duty cycle of the output clock signal output by the clock circuit can be locked at 50%. The pulse width adjustment module of the present disclosure not only has a simple structure, but also effectively reduces the circuit cost, which also can effectively monitor and adjust the duty cycle of the output clock signal and improve the performance of the circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A clock circuit having a clock input terminal and a clock output terminal, wherein the clock input terminal receives an input clock signal, and the clock output terminal outputs an output clock signal, the clock circuit comprising:

a pulse width adjustment module including a pulse width input terminal, a control terminal, a power terminal, a ground terminal, and a pulse width output terminal, the pulse width input terminal electrically connected to the clock input terminal to receive the input clock signal, the power terminal electrically connected to a first reference voltage, and the ground terminal electrically connected to a ground voltage;

a sampling module including a first input terminal, a second input terminal, and a first output terminal, the first input terminal of the sampling module electrically connected to the clock output terminal of the clock circuit, the sampling module used for sampling an output voltage of the clock output terminal of the clock circuit to generate a first sampling voltage, and the first output terminal used to output the first sampling voltage;

a comparing module including a first comparing input terminal, a second comparing input terminal, and a comparing output terminal, the second comparing input terminal electrically connected to the first output terminal of the sampling module, and the second comparing input terminal receiving the first sampling voltage, the comparing output terminal of the comparing module electrically connected to the control terminal of the pulse width adjustment module; and a differential signal converting module defined between the pulse width output terminal and the clock output terminal, the differential signal converting module including a differential input terminal, a positive differential signal output terminal, and a negative differential signal output terminal;

wherein the clock circuit further includes another clock output terminal, the differential input terminal is electrically connected to the pulse width output terminal of the pulse width adjustment module, the positive differential signal output terminal and the negative differential signal output terminal are electrically connected to the clock output terminal of the clock circuit and the another clock output terminal to output two clock signals with a phase difference of 180 degrees, respectively, and the second input terminal of the sampling module is electrically connected to the another clock output terminal.

2. The clock circuit of claim 1, wherein the first comparing input terminal receives a second sampling voltage of the another clock output terminal, and the second comparing input terminal receives the first sampling voltage of the clock output terminal, the first sampling voltage is determined based on the output clock signal of the clock output terminal, and the second sampling voltage is determined based on an output clock signal of the another clock output terminal.

3. The clock circuit of claim 1, wherein the first comparing input terminal is electrically connected to a comparing reference voltage, the second comparing input terminal is electrically connected to the first sampling voltage, and the first sampling voltage is determined based on the output clock signals of the clock output terminal and the another clock output terminal.

4. The clock circuit of claim 1, wherein the first comparing input terminal is electrically connected to a comparing reference voltage, the second comparing input terminal is electrically connected to the first sampling voltage, and the first sampling voltage is determined based on the output clock signal of the clock output terminal.

5. The clock circuit of claim 1, wherein the pulse width adjustment module includes:

a first high side switch including a first terminal, a second terminal, and a third terminal;

a second high side switch including a first terminal, a second terminal, and a third terminal;

a first low side switch including a first terminal, a second terminal, and a third terminal; and a second low side switch including a first terminal, a second terminal, and a third terminal;

wherein the first terminal of the first high side switch is electrically connected to the power terminal of the pulse width adjustment module, the second terminal of the first high side switch is electrically connected to the second terminal of the second low side switch, the third terminal of the first high side switch is electrically connected to the first terminal of the second high side switch, the second terminal of the second high side switch is electrically connected to the second terminal of the first low side switch, the third terminal of the second high side switch is electrically connected to the first terminal of the first low side switch, the third terminal of the first low side switch is electrically connected to the first terminal of the second low side switch, and the third terminal of the second low side switch is electrically connected to the ground terminal.

6. The clock circuit of claim 5, wherein the comparing output terminal of the comparing module outputs a control voltage for controlling the first high side switch and the second low side switch to adjust a waveform and a duty cycle of the output clock signal.

7. The clock circuit of claim 5, wherein the first high side switch and the second high side switch are P-type metal oxide semiconductor field effect transistors, and the first low side switch and the second low side switch are N-type metal Oxide semiconductor field effect transistors.

8. The clock circuit of claim 5, wherein the second terminal of the first high side switch and the second terminal of the second low side switch are electrically connected to the control terminal of the pulse width adjustment module and the comparing output terminal of the comparing module, the second terminal of the second high side switch and the second terminal of the first low side switch are electrically connected to the pulse width input terminal and the clock input terminal of the pulse width adjustment module.

9. The clock circuit of claim 1, wherein the first reference voltage is greater than 0V.

10. A clock circuit having a clock input terminal and a clock output terminal, wherein the clock input terminal receives an input clock signal, and the clock output terminal outputs an output clock signal, the clock circuit comprising:

a first inverter including a first terminal, and a second terminal, the first terminal of the first inverter electrically connected to the clock input terminal, and the second terminal of the first inverter electrically connected to the clock output terminal;

a second inverter including a first terminal and a second terminal, the first terminal of the second inverter electrically connected to the clock input terminal;

a pulse width adjustment module including a pulse width input terminal, a control terminal, a power terminal, a ground terminal, and a pulse width output terminal, the pulse width input terminal electrically connected to the clock input terminal to receive the input clock signal through the second inverter and a buffer circuit, and the power terminal electrically connected to a first reference voltage;

a sampling module including a first terminal and a second terminal, the first terminal of the sampling terminal electrically connected to the clock output terminal of the clock circuit, the sampling module used for sampling an output voltage of the clock output terminal of the clock circuit to generate a first sampling voltage; and a comparing module including a first comparing input terminal, a second comparing input terminal, and a comparing output terminal, the first comparing input terminal electrically connected to a comparing reference voltage, the second comparing input terminal electrically connected to the second terminal of the sampling module, and the comparing output terminal electrically connected to the control terminal of the pulse width adjustment module;

wherein the second terminal of the second inverter is electrically connected to the pulse width input terminal of the pulse width adjustment module.

11. The clock circuit of claim 10, wherein the pulse width adjustment module including:

a first high side switch including a first terminal, a second terminal, and a third terminal;

a second high side switch including a first terminal, a second terminal, and a third terminal;

a first low side switch including a first terminal, a second terminal, and a third terminal; and a second low side switch including a first terminal, a second terminal, and a third terminal;

wherein the first terminal of the first high side switch is electrically connected to the power terminal of the pulse width adjustment module, the second terminal of the first high side switch is electrically connected to the second terminal of the second low side switch, the third terminal of the first high side switch is electrically connected to the first terminal of the second high side switch, the second terminal of the second high side switch is electrically connected to the second terminal of the first low side switch, the third terminal of the second high side switch is electrically connected to the first terminal of the first low side switch, the third terminal of the first low side switch is electrically connected to the first terminal of the second low side switch, and the third terminal of the second low side switch is electrically connected to the ground terminal.

12. The clock circuit of claim 11, wherein the first high side switch and the second high side switch are P-type metal oxide semiconductor field effect transistors, and the first low side switch and the second low side switch are N-type metal Oxide semiconductor field effect transistors.

13. The clock circuit of claim 11, wherein the comparing output terminal of the comparing module outputs a control voltage for controlling the first high side switch and the second low side switch to adjust a waveform and a duty cycle of the output clock signal.

14. A clock circuit having a first clock input terminal, a second clock input terminal, a first clock output terminal, and a second clock output terminal, wherein the first clock input terminal receives a first input clock signal, the second clock input terminal receives a second input clock signal, and the first clock output terminal and the second clock output terminal outputs output clock signals, the clock circuit comprising:

a first clock inverter including a first terminal and a second terminal, the first terminal of the first clock inverter electrically connected to the first clock input terminal, the second terminal of the first clock inverter electrically connected to the first clock output terminal;

a second clock inverter including a first terminal and a second terminal, the first terminal of the second clock inverter electrically connected to the second clock input terminal, and the second terminal of the second clock inverter electrically connected to the second clock output terminal;

a first pulse width adjustment module including a first pulse width input terminal, a first control terminal, a first power terminal, a first ground terminal, and a first pulse width output terminal, the first pulse width input terminal receiving the first input clock signal, the first power terminal electrically connected to a first reference voltage, the first ground terminal electrically connected to a second reference voltage, and the first pulse width output terminal electrically connected to the second clock output terminal;

a second pulse width adjustment module including a second pulse width input terminal, a second control terminal, a second power terminal, a second ground terminal, and a second pulse width output terminal, the second pulse width input terminal receiving the second clock input terminal, the second power terminal electrically connected to a third reference voltage, the second ground terminal electrically connected to a fourth reference voltage, and the second pulse width output terminal electrically connected to the first clock output terminal;

a first sampling module including a first terminal and a second terminal, the first terminal of the first sampling module electrically connected to the first clock output terminal of the clock circuit, the first sampling module used for sampling an output voltage of the first clock output terminal of the clock circuit to generate a first sampling voltage;

a second sampling module including a first terminal and a second terminal, the first terminal of the second sampling module electrically connected to the second clock output terminal of the clock circuit, the second sampling module used for sampling an output voltage of the second clock output terminal of the clock circuit to generate a second sampling voltage;

a first comparing module including a first comparing input terminal, a second comparing input terminal, and a comparing output terminal, the first comparing input terminal of the first comparing module electrically connected to a first comparing reference voltage, the second comparing input terminal of the first comparing module electrically connected to the second terminal of the first sampling module, the second comparing input terminal receiving the first sampling voltage, the comparing output terminal of the first comparing module electrically connected to the first control terminal of the first pulse width adjustment module; and a second comparing module including a first comparing input terminal, a second comparing input terminal, and a comparing output terminal, the first comparing input terminal of the second comparing module electrically connected to a second comparing reference voltage, the second comparing input terminal of the second comparing module electrically connected to the second terminal of the second sampling module, the second comparing input terminal receiving the second sampling voltage, and the comparing output terminal of the second comparing module electrically connected to the second control terminal of the second pulse width adjustment module.

15. The clock circuit of claim 14, wherein the first pulse width adjustment module including:

a first high side switch including a first terminal, a second terminal, and a third terminal;

a second high side switch including a first terminal, a second terminal, and a third terminal;

a first low side switch including a first terminal, a second terminal, and a third terminal; and a second low side switch including a first terminal, a second terminal, and a third terminal;

wherein the first terminal of the first high side switch of the first pulse width adjustment module is electrically connected to the first power terminal of the first pulse width adjustment module, the second terminal of the first high side switch of the first pulse width adjustment module is electrically connected to the second terminal of the second low side switch of the first pulse width adjustment module, the third terminal of the first high side switch of the first pulse width adjustment module is electrically connected to the first terminal of the second high side switch of the first pulse width adjustment module, the second terminal of the second high side switch of the first pulse width adjustment module is electrically connected to the second terminal of the first low side switch of the first pulse width adjustment module, the third terminal of the second high side switch of the first pulse width adjustment module is electrically connected to the first terminal of the first low side switch of the first pulse width adjustment module, the third terminal of the first low side switch of the first pulse width adjustment module is electrically connected to the first terminal of the second low side switch of the first pulse width adjustment module, and the third terminal of the second low side switch of the first pulse width adjustment module is electrically connected to the first ground terminal of the first pulse width adjustment module.

16. The clock circuit of claim 15, wherein the second pulse width adjustment module including:

a first high side switch including a first terminal, a second terminal, and a third terminal;

a second high side switch including a first terminal, a second terminal, and a third terminal;

a first low side switch including a first terminal, a second terminal, and a third terminal; and a second low side switch including a first terminal, a second terminal, and a third terminal;

wherein the first terminal of the first high side switch of the second pulse width adjustment module is electrically connected to the second power terminal of the second pulse width adjustment module, the second terminal of the first high side switch of the second pulse width adjustment module is electrically connected to the second terminal of the second low side switch of the second pulse width adjustment module, the third terminal of the first high side switch of the second pulse width adjustment module is electrically connected to the first terminal of the second high side switch of the second pulse width adjustment module, the second terminal of the second high side switch of the second pulse width adjustment module is electrically connected to the second terminal of the first low side switch of the second pulse width adjustment module, the third terminal of the second high side switch of the second pulse width adjustment module is electrically connected to the first terminal of the first low side switch of the second pulse width adjustment module, the third terminal of the first low side switch of the second pulse width adjustment module is electrically connected to the first terminal of the second low side switch of the second pulse width adjustment module, and the third terminal of the second low side switch of the second pulse width adjustment module is electrically connected to the second ground terminal of the second pulse width adjustment module.

17. The clock circuit of claim 16, wherein the first comparing output terminal outputs a voltage for controlling the first high side switch and the second low side switch of the first pulse width adjustment module to adjust a waveform and a duty cycle of the output clock signal of the second clock output terminal, the second comparing output terminal of the second comparing module outputs a voltage for controlling the first high side switch and the second low side switch of the second pulse width adjustment module to adjust a waveform and a duty cycle of the output clock signal of the first clock output terminal.

18. The clock circuit of claim 16, wherein the first high side switch and the second high side switch of the second pulse width adjustment module are P-type metal oxide semiconductor field effect transistors, and the first low side switch and the second low side switch of the second pulse width adjustment module are N-type metal Oxide semiconductor field effect transistors.

19. The clock circuit of claim 15, wherein the first high side switch and the second high side switch of the first pulse width adjustment module are P-type metal oxide semiconductor field effect transistors, and the first low side switch and the second low side switch of the first pulse width adjustment module are N-type metal Oxide semiconductor field effect transistors.

20. The clock circuit of claim 14, wherein the first reference voltage is greater than 0V.

* * * * *